US008698984B2

(12) United States Patent
Matsui et al.

(10) Patent No.: US 8,698,984 B2
(45) Date of Patent: Apr. 15, 2014

(54) COLOR FILTER, LIQUID CRYSTAL DISPLAY DEVICE, AND COLOR FILTER PRODUCTION METHOD

(75) Inventors: Kohei Matsui, Tokyo (JP); Ryosuke Yasui, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 204 days.

(21) Appl. No.: 13/138,929

(22) PCT Filed: Apr. 28, 2010

(86) PCT No.: PCT/JP2010/003072
§ 371 (c)(1),
(2), (4) Date: Oct. 25, 2011

(87) PCT Pub. No.: WO2010/125823
PCT Pub. Date: Nov. 4, 2010

(65) Prior Publication Data
US 2012/0038863 A1 Feb. 16, 2012

(30) Foreign Application Priority Data

Apr. 28, 2009 (JP) ................................. 2009-109037

(51) Int. Cl.
*G02F 1/1335* (2006.01)
(52) U.S. Cl.
USPC .......................................... 349/106; 349/156
(58) Field of Classification Search
USPC .................... 349/155–156, 106–109
See application file for complete search history.

(56) References Cited

U.S. PATENT DOCUMENTS

| 7,209,198 B2 * | 4/2007 | Park et al. ..................... 349/106 |
| 7,426,009 B2 * | 9/2008 | Sawasaki et al. ............. 349/187 |
| 7,643,111 B2 * | 1/2010 | Kim et al. ..................... 349/108 |

FOREIGN PATENT DOCUMENTS

| JP | 2001-51266 | 2/2001 |
| JP | 2007-11231 | 1/2007 |
| JP | 2007-34136 | 2/2007 |
| JP | 2007-121344 | 5/2007 |
| JP | 2007-240711 | 9/2007 |
| JP | 2007-281317 | 10/2007 |
| JP | 2008-158138 | 7/2008 |

OTHER PUBLICATIONS

International Search Report for PCT/JP2010/003072, mailed Jun. 8, 2010.

* cited by examiner

*Primary Examiner* — James Dudek

(57) ABSTRACT

A color filter is provided which is formed by using a small mask continuous exposure method in which a portion between adjacent exposed areas is shielded from light by a blind shutter, and which has dummy photo spacers formed on a colored layer outside a display pixel area at a uniform height. Firstly, by using the small mask continuous exposure method, a colored layer is formed which extends in the X-axis direction astride the display pixel area and a frame area. At this time, the edges of the blind shutter which are parallel to the Y axis are each positioned so as to be distant by 500 μm to 1000 μm from a side which forms the outer circumference of the outermost opening and which is closest to the frame area extending in the Y-axis direction. Next, photo spacers are formed on the colored layer such that the central axis of each photo spacer is positioned in a range of positions that are distant by 300 μm or less from a side which is closest to the frame area extending in the Y-axis direction.

2 Claims, 6 Drawing Sheets

COLOR FILTER, LIQUID CRYSTAL DISPLAY DEVICE, AND COLOR FILTER PRODUCTION METHOD

CROSS REFERENCE TO RELATED APPLICATIONS

This application claims the benefit under 35 U.S.C. Section 371, of PCT International Application No. PCT/JP2010/003072, filed Apr. 28, 2010, which claimed priority to Japanese Application No. 2009-109037, filed Apr. 28, 2009, in the Japanese Patent Office, the disclosures of which are hereby incorporated by reference.

TECHNICAL FIELD

The present invention relates to color filters for use in, for example, liquid crystal display devices, and a color filter production method.

BACKGROUND ART

For display devices such as liquid crystal display devices, color filters are widespread for the purposes of color image display, reflectance reduction, contrast adjustment, spectral characteristic control, and the like. In order to produce a color filter, colored pixels need to be formed on a substrate so as to be aligned in a matrix. In order to form the colored pixels on the substrate, photolithography method is typically used widely. Specifically, photosensitive resin (hereinafter, referred to as a "resist") having coloring agent such as pigment and dye dispersed therein is firstly applied to a substrate by using a spin coating or a spinless coating method, and thereafter excessive solvent in the resist is removed by pre-baking. Subsequently, a photomask having an opening pattern (in the case of a negative type resist) corresponding to the colored pixels is used to expose the resist to light for representing the opening pattern. The exposure to light is performed by, for example, applying active energy ray from a high-pressure mercury lamp acting as a light source, to the resist through the photomask. Finally, the resist and developer are brought into contact with each other, to dissolve and remove unnecessary resist, and thereafter rinsing and post-baking are performed. These are repeated the number of times corresponding to the number of colors of the colored pixels.

In order to expose the resist to light for representing the opening pattern, a proximity exposure (close exposure) method in which the entire surface of the substrate can be exposed to light at one time may be used. In an exposure device used in the proximity exposure method, distribution of illuminance of light applied from an ultrahigh pressure mercury lamp acting as a light source is made uniform by using a fly-eye lens. Thereafter, light emitted from the fly-eye lens is transformed into parallel light beams by using a collimator lens. The photomask is positioned so as to be spaced from the substrate (to form a gap) by several tens of μm to several hundreds of μm. The parallel light beams are applied to the entire surface of the photomask. As a result, the opening pattern is transferred to the resist on the substrate at the same magnification.

The exposure device used for the proximity exposure method has a simple device structure as compared to, for example, an exposure device including a projection optical system. Therefore, use of the proximity exposure method is advantageous in that cost for the devices can be reduced. Further, the same area as that of the photomask can be exposed to light at one time. Therefore, use of a photomask corresponding to a size of an exposed area on the substrate is advantageous also in that process tact for the exposure process steps can be reduced.

However, in recent years, sizes of a color filter substrate and a TFT (Thin Film Transistor) substrate included in a liquid crystal panel tend to be increased. Exemplary substrate sizes are 1500 mm×1800 mm (the sixth generation), 2160 mm×2400 mm (the eighth generation), and 2850 mm×3050 mm (the tenth generation). The increase in size of a color filter substrate, and the like inevitably require increase in size of a photomask and increase in size of an illumination optical system of the proximity exposure device. As a result, a problem arises that production cost for photomasks is increased. Further, the increase in size of a color filter substrate leads to enlargement of a light-applied area, so that a problem also arises that energy efficiency of the applied light is reduced.

In order to solve the above-mentioned problems, an exposure method (hereinafter, referred to as a "maskless exposure method") may be used in which a pattern is directly formed on a substrate by using laser light without using a photomask. In this method, while laser light is being applied to the resist on the substrate, the laser light is modulated as necessary according to a pattern to be formed. Therefore, the maskless exposure method is advantageous in that use of expensive photomasks is unnecessary. However, for the maskless exposure method, development of a modulation device for modulating the laser light and/or a resist suitable for laser light to be used is difficult. The maskless exposure method has a lot of problems to be solved for realizing exposure to light for a color filter having a large size with reduced production cost.

Therefore, a method (hereinafter, referred to as a "small mask continuous exposure method) may be used in which a plurality of small masks are aligned, and a resist on a substrate is repeatedly exposed to light for representing an opening pattern of a photomask while the substrate is being conveyed. In the small mask continuous exposure method, a blind shutter positioned between the photomasks and a light source is opened or closed in synchronization with the conveying of the substrate, and thus switching between application of light to the resist and shielding of the resist from the light is controlled as necessary. As a result, the resist on the substrate is freely separated into an area (hereinafter, referred to as an "exposed area") which is exposed to light and an area (hereinafter, referred to as an "unexposed area") which is not exposed to light.

CITATION LIST

Patent Literature

Patent Literature 1: Japanese Laid-Open Patent Publication No. 2007-11231
Patent Literature 2: Japanese Laid-Open Patent Publication No. 2007-281317
Patent Literature 3: Japanese Laid-Open Patent Publication No. 2007-121344

SUMMARY OF THE INVENTION

Problems to be Solved by the Invention

When a color filter is formed on a substrate by using the small mask continuous exposure method, a plurality of color filters are formed on the same substrate by exposure to light in order to reduce production cost. In an exposed area on the substrate corresponding to a display pixel area of each color filter, a colored layer forming a colored pixel pattern is sequentially formed by exposure to light in a substrate conveying direction. On the other hand, a portion between exposed areas which are adjacent to each other along the substrate conveying direction is not exposed to light by the blind shutter being closed. At this time, below each of the edges of the blind shutter along the substrate conveying direction, an area (hereinafter, this area is referred to as a "gray area") in which an amount of applied light is insufficient is generated near the exposed area along the substrate conveying direction due to influence of diffraction of applied light and a collimation angle. A film thickness of a colored layer formed in the gray area is relatively small as compared to a film thickness of colored layers in the other exposed areas, and is gradually reduced toward each end of the colored layer along the substrate conveying direction.

On the display pixel area of the color filter substrate, photo spacers as well as the colored layers as described above are formed. Further, the photo spacers are generally provided also in an area outside the display pixel area (hereinafter, photo spacers which are provided outside the display pixel area are referred to as "dummy photo spacers" for convenience sake). When the dummy photo spacers are provided, a space (cell gap) which is formed, outside the display pixel area, between a substrate and an opposing substrate is maintained so as to be uniform.

Depending on specifications of a product, it is desired that the dummy photo spacers be provided on the colored layer outside the display pixel area. However, the film thickness of the colored layer outside the display pixel area is not uniform in the color filter produced by using the small mask method. Therefore, a problem may arise that the dummy photo spacers are not formed at the same height, and display quality is likely to be deteriorated.

Therefore, an object of the present invention is to make available: a color filter that is formed by using an exposure method for shielding a portion between adjacent exposed areas from light with a blind shutter, and that has, on a colored layer outside a display pixel area, dummy photo spacers formed at almost the same height; and a liquid crystal display device including the color filter. Further, another object of the present invention is to make available a method for producing, by using an exposure method for shielding a portion between adjacent exposed areas from light with a blind shutter, a color filter which has, on a colored layer outside a display pixel area, dummy photo spacers formed at almost the same height.

Solution to the Problems

A color filter according to the present invention has a plurality of pixels aligned in a matrix in a first direction and in a second direction orthogonal to the first direction, and has pixels of the same color aligned in the first direction. The color filter includes: a substrate; a light shielding layer which is lattice-shaped for separating, on the substrate, a plurality of openings corresponding to the plurality of pixels, respectively; a plurality of colored layers formed so as to cover the plurality of openings; and a plurality of photo spacers formed on the plurality of colored layers. Thickness of the colored layers is not uniform at least near both end portions in the first direction in a pair of areas extending, outside a rectangular area in which the plurality of openings are aligned, along sides of the rectangular area in the second direction, and the plurality of photo spacers are formed on the plurality of colored layers such that the central axis of each photo spacer is positioned only in a range of positions that are distant by 300 µm or less from a side which forms an outer circumference of the openings, and which is closest to a corresponding one of the pair of areas.

In a color filter production method according to the present invention, a plurality of color filters each of which has a plurality of colored pixels aligned in a matrix in a first direction and in a second direction orthogonal to the first direction, and has pixels of the same color aligned in the first direction, are aligned on a single substrate in at least the first direction. Specifically, a plurality of rectangular areas in which the plurality of color filters, respectively, are formed, are formed intermittently in the first direction such that the plurality of rectangular areas each include a light shielding layer which is lattice-shaped for separating, on the substrate, a plurality of openings corresponding to the plurality of colored pixels, respectively. A plurality of colored layers that cover the plurality of openings are formed by repeating, multiple times, a process for continuously or intermittently exposing, to light, the substrate having a resist applied thereto while conveying the substrate in the first direction, and a process for partially shielding, from light, an area between the rectangular areas adjacent to each other in the first direction by using a blind shutter. The plurality of colored layers of a plurality of colors are formed by repeating formation of the colored layers the number of times corresponding to the number of colors of the colored pixels forming each color filter. Photo spacers are formed on the plurality of colored layers. In a process of partially shielding, from light, the area between the rectangular areas by using the blind shutter, a pair of edges of the blind shutter along the second direction is positioned so as to be each distant by 500 µm to 1000 µm from a side which forms the outer circumference of the openings, and which is closest to a corresponding one of a pair of areas extending, outside a corresponding one of the plurality of rectangular areas in which the plurality of openings are aligned, along a side of the corresponding one of the plurality of rectangular areas in the second direction. The photo spacers are positioned, when the photo spacers are formed, such that the central axis of each photo spacer is positioned only in a range of positions that are distant by 300 µm or less from a side which forms the outer circumference of the openings, and which is closest to a corresponding one of the pair of areas.

Advantageous Effects of the Invention

According to the present invention, production of a color filter having dummy photo spacers formed at a uniform height on a colored layer outside a display pixel area, and a liquid crystal display device including the color filter can be realized by using an exposure method in which an area between adjacent exposed areas is shielded from light by a blind shutter.

DESCRIPTION OF EMBODIMENTS

Embodiment

Figure 1:
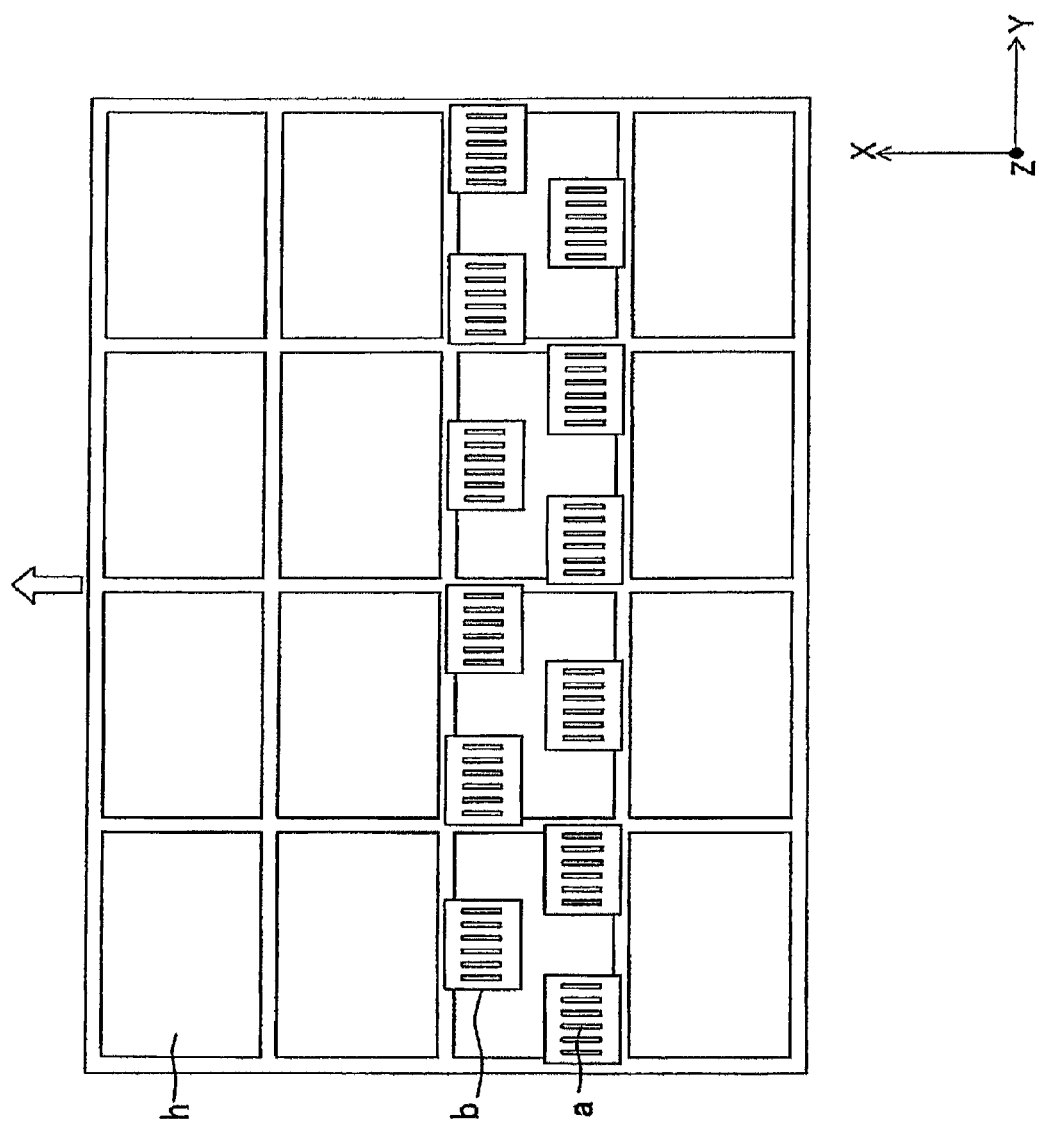
FIG. 1 is a schematic diagram illustrating an exposure method according to an embodiment of the present invention.
Figure 2:
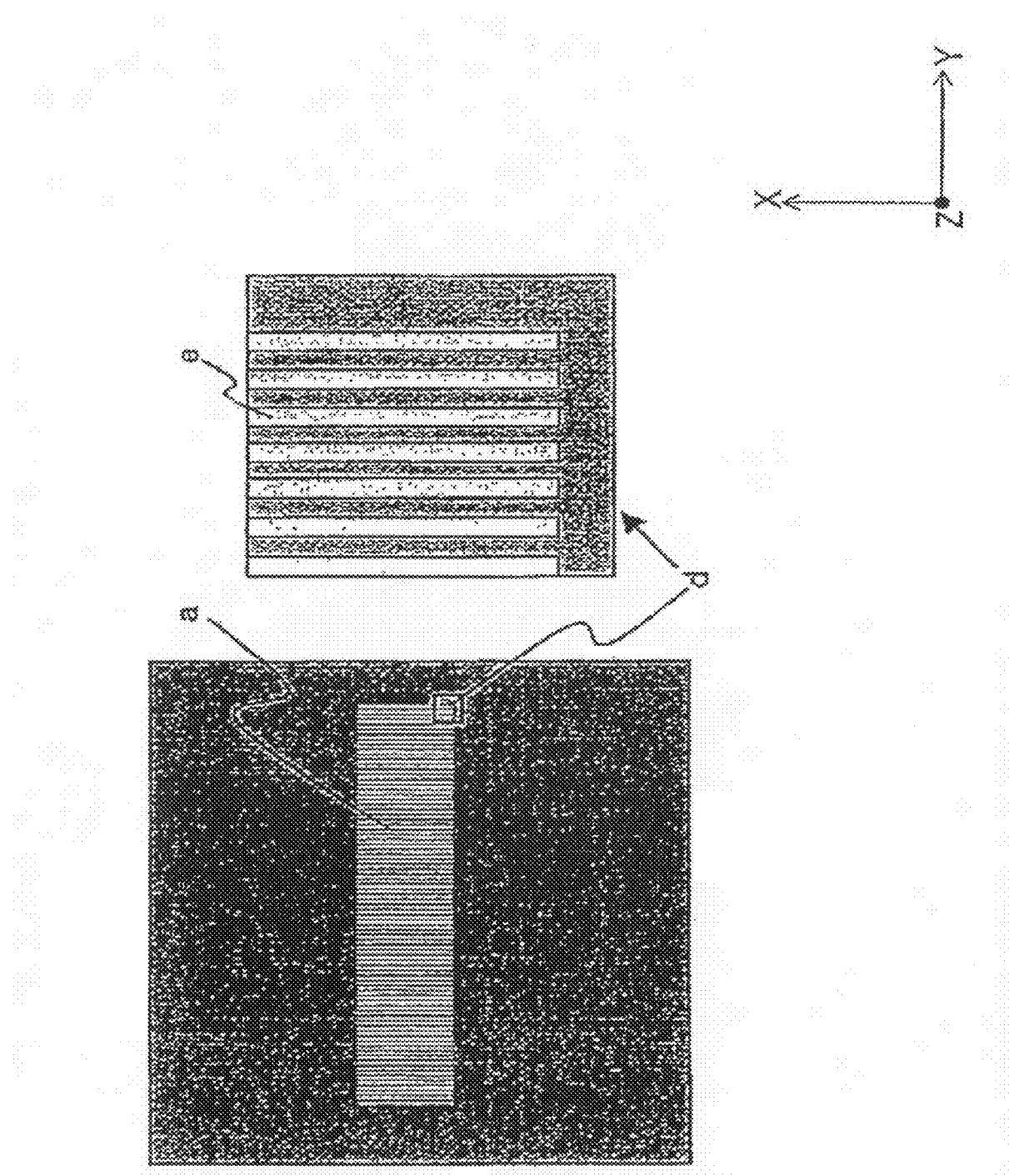
FIG. 2 is a partially enlarged view of a photomask shown in FIG. 1.
Figure 3:
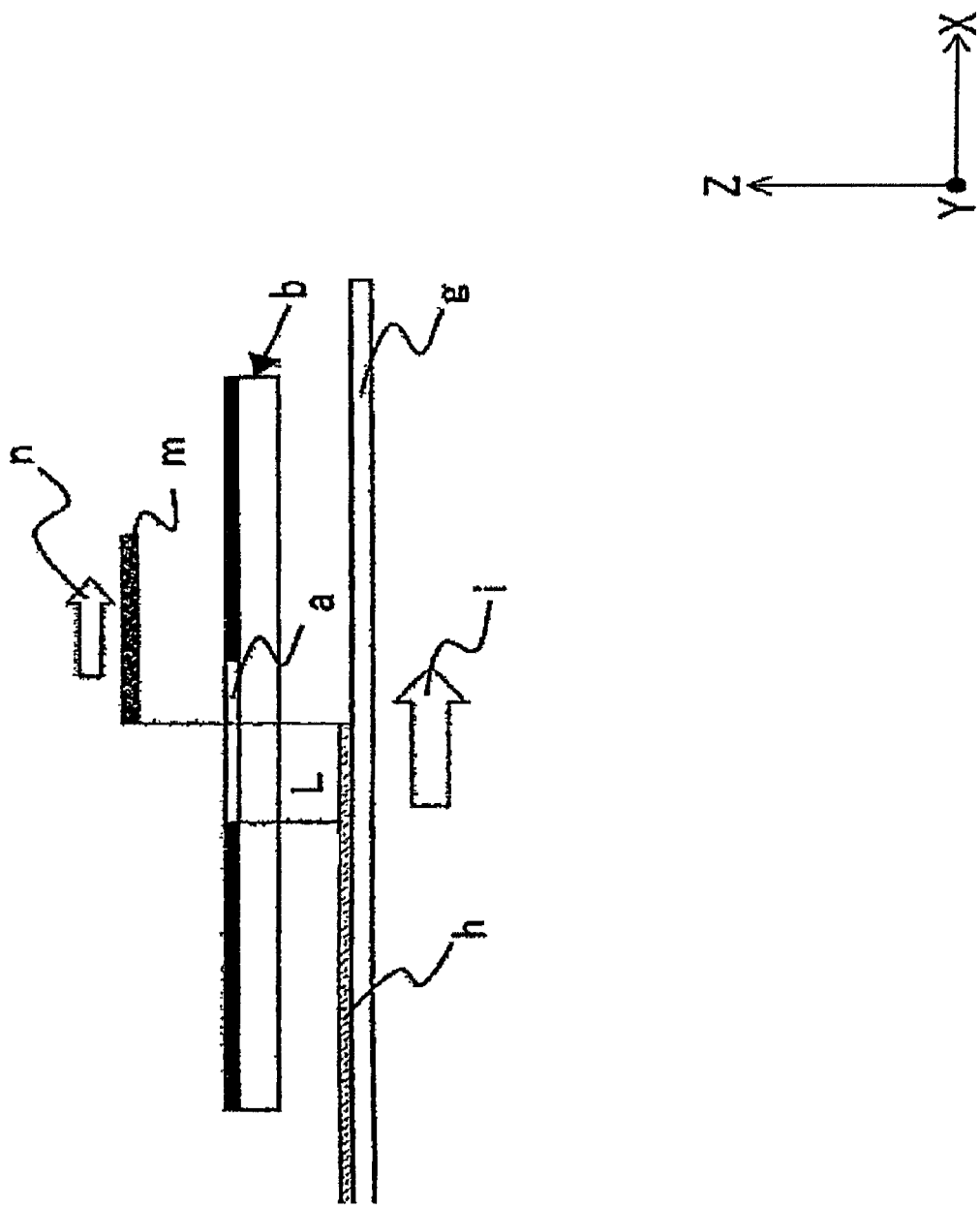
FIG. 3 is a cross-sectional view illustrating a state in which exposure to light is performed in a small mask continuous exposure method.

FIG. 1 is a schematic diagram illustrating an exposure method according to an embodiment of the present invention. FIG. 2 is a partially enlarged view of a photomask shown in FIG. 1. FIG. 3 is a cross-sectional view illustrating a state in which exposure to light is performed in a small mask continuous exposure method. It is to be noted that a substrate conveying direction is defined as the X-axis positive direction in all the following drawings.

A color filter production method according to an embodiment of the present invention is used for forming a plurality of color filters on the same substrate so as to be intermittently aligned in at least the X-axis direction.

In the present embodiment, as shown in FIG. 1, twelve photomasks b are separated into and aligned in two rows, and patterning is performed on a resist placed on a substrate by using these photomasks b. More specifically, six photomasks b are positioned in the first row (on a substrate entering side) so as to be spaced from each other by a predetermined distance, and six photomasks b are positioned in the second row so as to complement the space portions between the photomasks in the first row. As shown in FIG. 2, stripe-shaped slits a are formed on each of the photomasks b, and the slits a are formed by openings e extending in the X-axis direction being aligned in the Y-axis direction. The twelve photomasks b enable each of the four display pixel areas aligned in the Y-axis direction to be intermittently or continuously exposed to light in the X-axis direction.

Further, in the present embodiment, as shown in FIG. 3, a substrate g is conveyed in the X-axis positive direction (an arrow i in the drawings) by a substrate conveying device (not shown). Each of the photomasks b is fixed in an exposure head within a range in which light (not shown) from a light source is applied. Further, a blind shutter m is positioned between the photomasks b and the light source so as to be freely movable in the X-axis direction by means of a not-illustrated movement mechanism.

In order to produce a color filter substrate, firstly, black matrixes (not shown) are formed as light shielding layers on the substrate g. More specifically, a lattice-shaped black matrix is formed in a rectangular display pixel area h on the substrate g so as to separate a plurality of openings from each other. Further, in a rectangular frame-and-band-shaped area (a frame area) surrounding the display pixel area h, the black matrix is formed on the entire surface of the substrate g. Further, outside the display pixel area h, peripheral dummy patterns and alignment marks are simultaneously formed.

A black matrix forming method is not limited to any specific one, and various methods including a photolithography method are applicable. Further, as the substrate g, any substrate can be used which has transparency, strength, heat resistance, and weather resistance which are required when used as a color filter. For example, a glass substrate, a quartz substrate, or a transparent resin substrate such as an acrylic substrate can be preferably used.

Next, while the substrate g having a color resist of a first color (for example, red) applied thereto, is being conveyed in the X-axis positive direction, a colored layer of the first color is formed on the display pixel area h. More specifically, while the substrate g is being continuously conveyed in the X-axis positive direction in a state where the blind shutter m is opened, light from the light source is applied to the photomasks b. When the light from the light source is continuously applied, the stripe-shaped patterns of the slits a are continuously baked onto the color resist of the display pixel area h in the X-axis direction. At this time, a relative position between the substrate g and the photomasks b is sequentially adjusted while positions of the black matrixes and the slits a of the photomasks b are read by a CCD camera. On the other hand, a portion between a pair of display pixel areas h which are adjacent to each other in the X-axis direction is partially shielded from light by the blind shutter the width of which is set so as to be narrower than a distance between the display pixel areas which are adjacent to each other in the X-axis direction. It is to be noted that the width of the blind shutter is variable in the X-axis direction, and is adjusted as necessary according to a kind of the resist and exposure condition (an amount of applied light, a development time). At this time, the blind shutter m in a closed state is moved in synchronization with the conveying of the substrate g (a direction n indicated by an arrow in FIG. 3). After these continuous exposure process step and light shielding process step are repeatedly performed multiple times, predetermined process steps such as development and rinsing are performed. By performing the process steps described above, the colored layer of the first color is formed so as to extend in the X-axis direction, and continuously cover the openings which extend in the X-axis direction in the display pixel area h. It is to be noted that the opening pattern may be baked onto the color resist in a dotted manner by applying light from the light source which is being blinked.

After the colored layer of the first color has been formed, the colored layer forming process described above is repeatedly performed for a colored layer of a second color (for example, blue) and a colored layer of a third color (for example, green), and thus the colored layers are formed in the same manner as that for the colored layer of the first color. As a result, the red, blue, and green colored layers extending in the X-axis direction are aligned in the Y-axis direction so as to be repeated in a predetermined order (for example, the order of the red, blue, and green ones). Also when a colored layer of a fourth color (for example, yellow) is formed in addition to the red, blue, and green colored layers, the similar exposure method can be used.

Thereafter, a transparent electrode film is formed by using indium tin oxide (ITO) in a sputtering method so as to cover the entire surfaces of the colored layer and the black matrixes on the substrate.

Finally, on the substrate on which the colored layer has been formed, for regulating a space between the substrate and the opposing substrate, photo spacers are formed in the display pixel area and dummy photo spacers are formed outside the display pixel area. The dummy photo spacers are formed on the colored layer such that the central axes of the photo spacers are positioned only in a range of positions which are distant by 300 μm or less from a side which forms the outer circumference of the openings and which is closest to an area shielded from light by the blind shutter (the positions at which the dummy photo spacers are formed will be described below in detail). In order to form the photo spacers on the substrate, resist for forming the photo spacers and the dummy photo spacers by exposure to light is applied. The entire surface of the substrate is exposed to light at one time by using a photomask having formed thereon patterns corresponding to the photo spacers and the dummy photo spacers.

Hereinafter, the positions at which the dummy photo spacers are formed on the colored layer described above will be described in detail.

Figure 4:
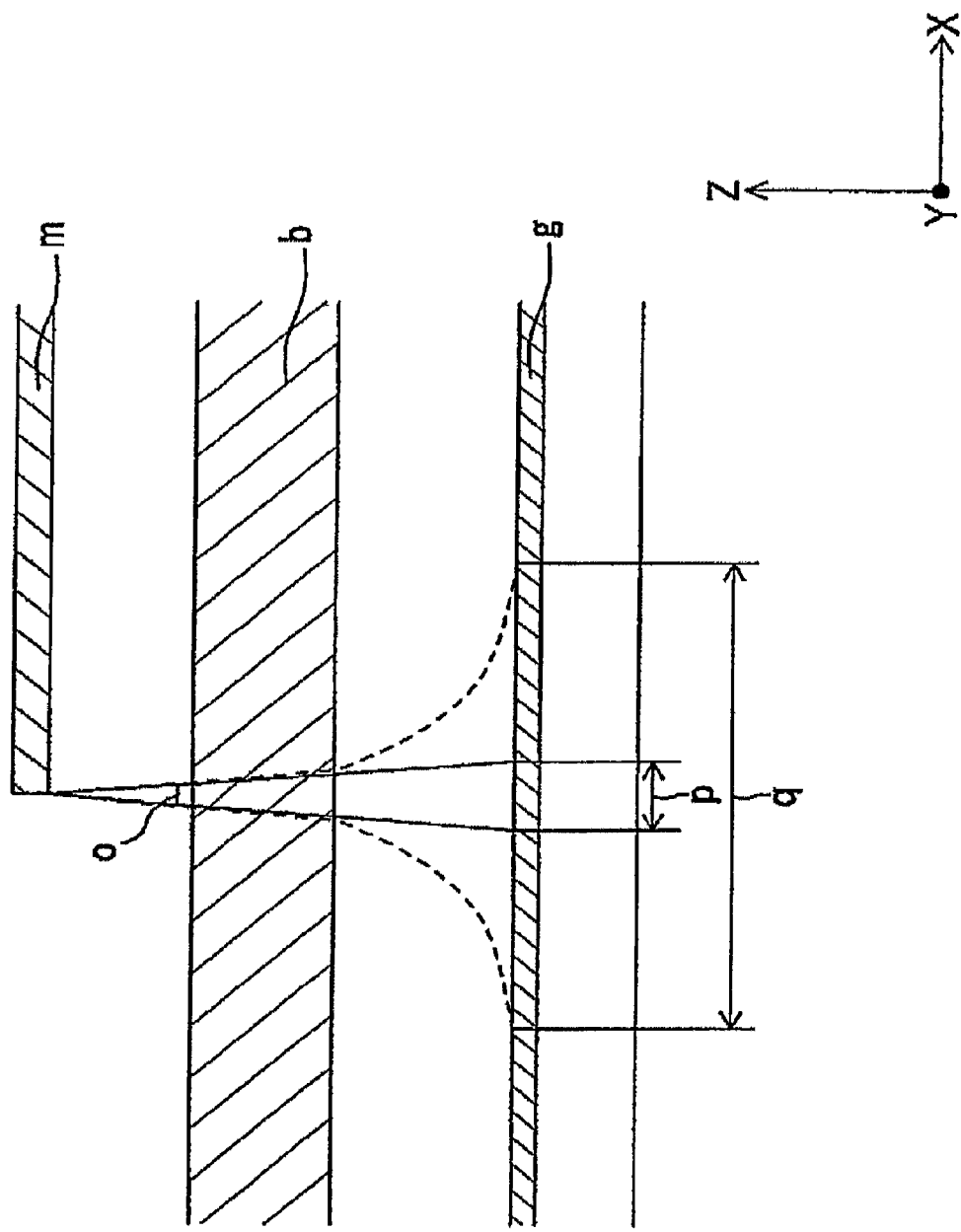
FIG. 4 is a cross-sectional view illustrating a gray area generation mechanism.

FIG. 4 is a cross-sectional view illustrating a gray area generation mechanism.

When light-shielding is performed by the blind shutter m, light is diffracted due to the edges of the blind shutter m which are parallel to the Y axis, and an intensity of light applied to an area indicated by q is reduced as compared to an intensity of light applied to the display pixel area h. Further, since the applied light forms a collimation angle o (an angle of light incident on the light applied surface), light enters the bottom side of the blind shutter m, and, in contrast, a portion of the applied light is blocked by the blind shutter m (in an area indicated by p). As a result, an area (gray area) q is generated in which an amount of applied light is insufficient. An amount of applied light in the gray area q is reduced toward the outside of the display pixel area h in the X-axis direction (in the X-axis positive direction in FIG. 4). In FIG. 4, for limitations of space on sheet, only the vicinity of one of the edges of the blind shutter m which are parallel to the Y axis is shown. However, in the other of the edges of the blind shutter m which are parallel to the Y axis, a similar gray area is generated.

Figure 5:
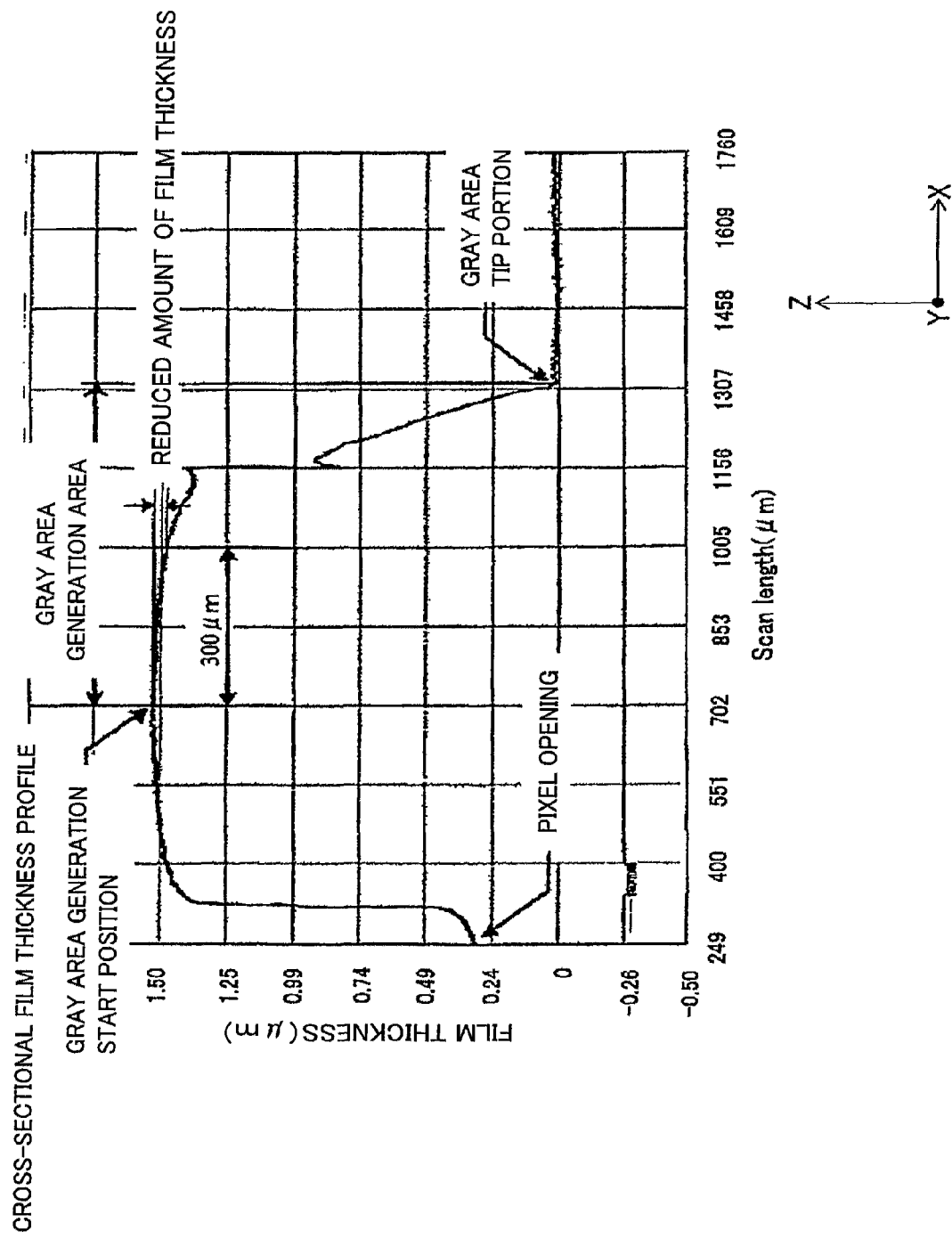
FIG. 5 is a diagram illustrating a profile of an end portion of a colored layer.

FIG. 5 is a diagram illustrating a profile of the colored layer in the gray area.

The blind shutter is positioned above a position outside the display pixel area when exposure to light is performed, and thus the colored layer (a portion corresponding to a gray area generation area indicated in FIG. 5) formed in the gray area q described above is positioned in the frame area. The colored layer formed in the gray area has a relatively reduced film thickness as compared to the colored layer formed in the display pixel area. More preferably, the film thickness of the colored layer is abruptly reduced toward the tip portion of the gray area from a position which is distant from a gray area start position by 300 µm or more in the X-axis positive direction. On the other hand, a degree of reduction in film thickness of the colored layer is small in a range of positions which are distant from the gray area generation start position by 300 µm or less in the X-axis positive direction. This is because the influence of the diffraction described with reference to FIG. 4 is relatively small in the range of 300 µm or less. It is to be noted that the colored layers having their film thicknesses reduced are similarly formed in any other portions which are shielded from light near the edges of the blind shutter.

Further, the length (in the X axis direction) of the colored layer formed in the gray area q is about 600 µm at a maximum, and the length of the colored layer actually formed varies in a range of 300 µm to 600 µm. Therefore, in consideration of the positional accuracy of the blind shutter, the edge of the blind shutter which is parallel to the Y axis is positioned, when exposure to light is performed, so as to be distant by 500 µm to 1000 µm from a side (a side w shown in FIG. 6(c)) forming the outer circumference of the outermost opening. When the position of the blind shutter is thus adjusted, if an error in positioning the blind shutter occurs, the gray area can be constantly positioned outside the display pixel area. As a result, regardless of the positional accuracy of the blind shutter, it is possible to reduce variation in film thickness of the colored layer in a range of positions which are distant by 300 µm or less outwardly in the X axis direction from the side w (FIG. 6(c)) forming the outer circumference of the openings.

The film thickness of the colored layer in an area of positions distant from the gray area generation start position by 300 µm or less was measured at optionally selected five positions (n:1 to 5). As the result, values by which the film thicknesses were reduced from the film thickness of the colored layer in the display pixel area are indicated in Table 1.

TABLE 1

| n | MEASURED VALUE (µm) |
|---|---|
| 1 | 0.043 |
| 2 | 0.054 |
| 3 | 0.050 |
| 4 | 0.046 |
| 5 | 0.049 |
| AVERAGE | 0.048 |

As indicated in Table 1, it was confirmed that in the area of positions distant from the gray area generation start position by 300 µm or less, the reduced value of the film thickness of the colored layer was approximately 0.05 µm or less.

Figure 6:
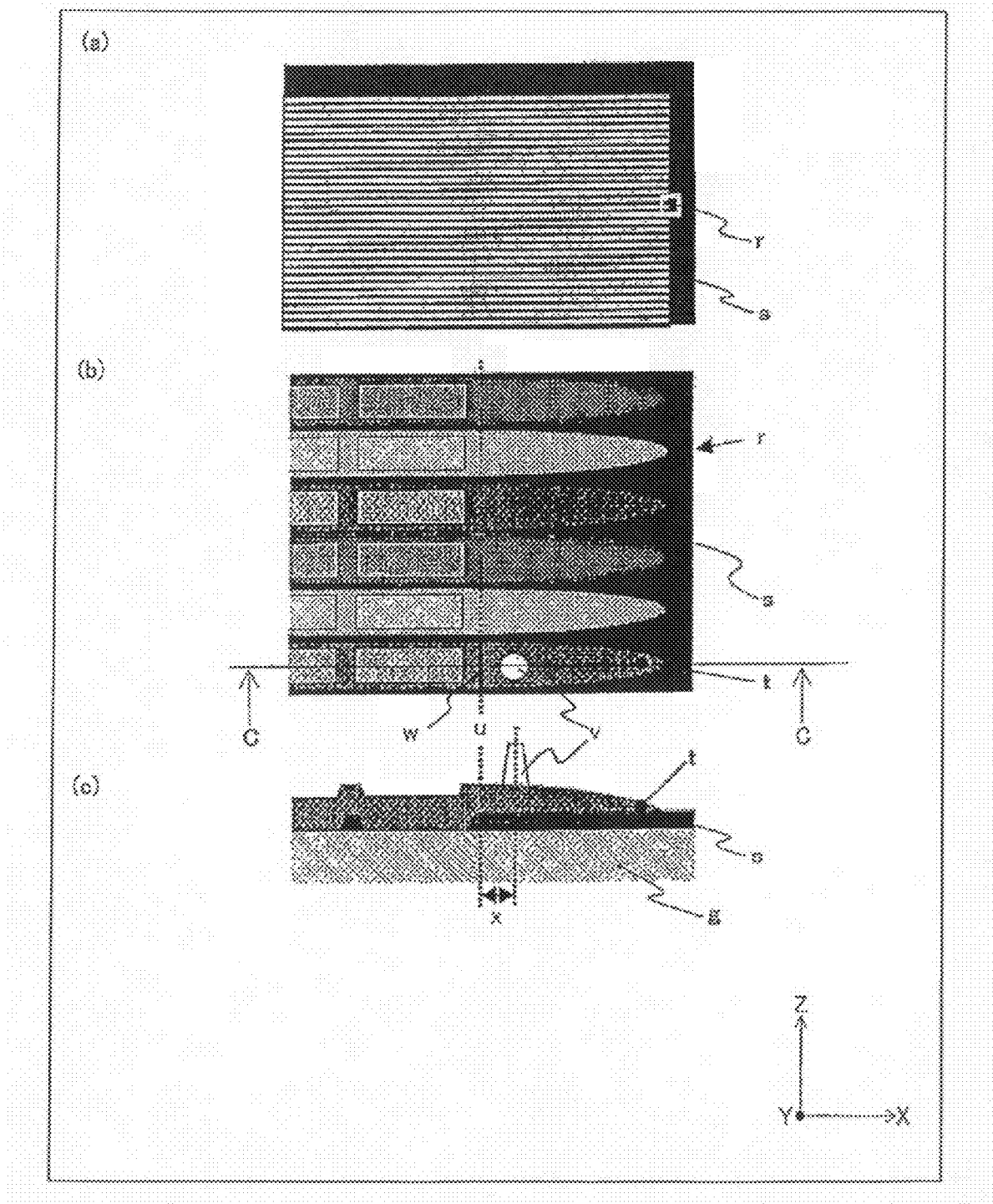
FIG. 6 is a partially enlarged view of a color filter according to the embodiment of the present invention.

FIG. 6 is a partially enlarged view of a color filter according to the embodiment of the present invention. More specifically, FIG. 6(a) is a diagram illustrating a portion of the color filter, and FIG. 6(b) is an enlarged view of a portion indicated as r in FIG. 6(a), and FIG. 6(c) is a cross-sectional view taken along a line C-C of FIG. 6(b).

In the color filter produced according to the present embodiment, dummy photo spacers v are formed on the colored layer such that the central axis of each dummy photo spacer v is positioned only in a range of positions distant by 300 µm or less (a range indicated by x in FIG. 6 corresponds to the range of positions distant by 300 µm or less) from a corresponding one of a pair of sides w which form the outer circumference of the openings and which are closest to frame areas s extending in the Y-axis direction (in FIG. 6, only one of the pair of sides w is indicated). It is to be noted that reference character u represents a virtual line obtained by connecting side w of each colored layer. As a result, the dummy photo spacers v can be positioned assuredly outside an area in which the film thickness of the colored layer is not uniform.

As described above, when the color filter production method according to the present embodiment is used, the dummy photo spacers can be formed at a uniform height on the colored layer outside the display pixel area by use of the small mask continuous exposure method in which a portion between adjacent exposed areas is shielded from light by using the blind shutter. As a result, production of a display device having a preferable display quality can be realized.

It is to be noted that, although black matrixes are used as light shielding layers in the present embodiment, the present invention is not limited thereto. Any light shielding layer can be used which can separate a plurality of openings corresponding to the pixels, respectively. For example, an electrode layer that is formed of thin metal film and formed on the substrate may be used.

Further, in the embodiment described above, the colored layer of each color is formed in a band shape which continuously extends in the X-axis direction. However, the colored layer may be formed of dots of the same color so as to extend in the X-axis direction.

A liquid crystal display device using the color filter according to the embodiment described above can be produced such that the color filter and the opposing substrate are bonded to each other, and liquid crystal is sealed between both of the substrates.

INDUSTRIAL APPLICABILITY

The present invention can be used for producing, for example, a color filter for use in a liquid crystal display device and the like.

DESCRIPTION OF THE REFERENCE CHARACTERS a slit
b photomask
d a portion of slits
e opening
g substrate
h display pixel area
m blind shutter
collimation angle
p low illuminance area generated due to collimation angle
q gray area
s frame area
t edge of colored layer
w outer circumference of opening
u virtual line
v dummy photo spacer

The invention claimed is:

1. A color filter that has a plurality of pixels aligned in a matrix in a first direction and in a second direction orthogonal to the first direction, and that has pixels of the same color aligned in the first direction, the color filter comprising:
    a substrate;
    a light shielding layer which is lattice-shaped for separating, on the substrate, a plurality of openings corresponding to the plurality of pixels, respectively;
    a plurality of colored layers formed so as to cover the plurality of openings; and
    a plurality of photo spacers formed on the plurality of colored layers, wherein thickness of the colored layers is not uniform at least near both end portions in the first direction in a pair of areas extending, outside a rectangular area in which the plurality of openings are aligned, along sides of the rectangular area in the second direction, and the plurality of photo spacers are formed on the plurality of colored layers such that the central axis of each photo spacer is positioned only in a range of positions that are distant by 300 μm or less from a side which forms an outer circumference of the openings, and which is closest to a corresponding one of the pair of areas.

2. A liquid crystal display device having a plurality of pixels aligned in a first direction and in a second direction orthogonal to the first direction, the liquid crystal display device comprising:
    a color filter;
    an opposing substrate which opposes the color filter; and
    liquid crystal sealed between the color filter and the opposing substrate, wherein
    the color filter includes:
        a substrate;
        a light shielding layer which is lattice-shaped for separating, on the substrate, a plurality of openings corresponding to the plurality of pixels, respectively;
        a plurality of colored layers formed so as to cover the plurality of openings; and
        a plurality of photo spacers formed on the plurality of colored layers, wherein
    thickness of the colored layers is not uniform at least near both end portions in the first direction in a pair of areas extending, outside a rectangular area in which the plurality of openings are aligned, along sides of the rectangular area in the second direction, and the plurality of photo spacers are formed on the plurality of colored layers only in a range of positions that are distant by 300 μm or less from a side which forms an outer circumference of the openings, and which is closest to a corresponding one of the pair of areas.

* * * * *